US012540390B2

(12) United States Patent
Komori

(10) Patent No.: US 12,540,390 B2
(45) Date of Patent: Feb. 3, 2026

(54) RAW MATERIAL SUPPLY SYSTEM

(71) Applicant: Tokyo Electron Limited, Tokyo (JP)

(72) Inventor: Eiichi Komori, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 663 days.

(21) Appl. No.: 17/905,843

(22) PCT Filed: Mar. 4, 2021

(86) PCT No.: PCT/JP2021/008452
§ 371 (c)(1),
(2) Date: Sep. 8, 2022

(87) PCT Pub. No.: WO2021/187134
PCT Pub. Date: Sep. 23, 2021

(65) Prior Publication Data

US 2023/0151486 A1 May 18, 2023

(30) Foreign Application Priority Data

Mar. 17, 2020 (JP) ................................ 2020-046446
Jul. 8, 2020 (JP) ................................ 2020-118056

(51) Int. Cl.
*C23C 16/448* (2006.01)
*C23C 16/455* (2006.01)
*C23C 16/52* (2006.01)

(52) U.S. Cl.
CPC .... *C23C 16/4481* (2013.01); *C23C 16/45561* (2013.01); *C23C 16/52* (2013.01)

(58) Field of Classification Search
None
See application file for complete search history.

(56) References Cited

U.S. PATENT DOCUMENTS

2004/0058510 A1 3/2004 Hyodo et al.
2008/0191153 A1* 8/2008 Marganski .......... C23C 16/4481 118/715
2015/0145154 A1* 5/2015 Chandrasekharan ........................ C23C 16/4481 261/147
2018/0163307 A1* 6/2018 Carlson ............... C23C 16/4481
2019/0186003 A1* 6/2019 Eldridge ............. C23C 16/4481
2020/0340110 A1* 10/2020 Hendrix .............. C23C 16/4481
(Continued)

FOREIGN PATENT DOCUMENTS

CN 104651806 A 5/2015
JP 2004-111787 A 4/2004
JP 2004-115831 A 4/2004
(Continued)

*Primary Examiner* — Binu Thomas
(74) *Attorney, Agent, or Firm* — Armstrong Teasdale LLP

(57) ABSTRACT

A raw material supply system includes: a first storage part configured to store a solution obtained by dissolving a first solid raw material in a solvent or a dispersion obtained by dispersing the first solid raw material in the solvent; a second storage part configured to store the solution or the dispersion transported from the first storage part; a detection part configured to detect an amount of the solution or the dispersion stored in the first storage part; and a heating part configured to heat a second solid raw material formed by removing the solvent from the solution or the dispersion stored in the second storage part.

17 Claims, 7 Drawing Sheets

(56) References Cited

U.S. PATENT DOCUMENTS

| | | | | |
|---|---|---|---|---|
| 2022/0064786 | A1* | 3/2022 | Itsuki | C23C 16/4481 |
| 2022/0396873 | A1* | 12/2022 | Okabe | C23C 16/4481 |

FOREIGN PATENT DOCUMENTS

| | | | |
|---|---|---|---|
| JP | 2005-217089 | A | 8/2005 |
| JP | 2005-256107 | A | 9/2005 |
| JP | 2007-314863 | A | 12/2007 |
| JP | 2008-522029 | A | 6/2008 |
| JP | 2015-110837 | A | 6/2015 |
| JP | 2016-191140 | A | 11/2016 |

* cited by examiner

RAW MATERIAL SUPPLY SYSTEM

CROSS-REFERENCE TO RELATED APPLICATIONS

The present application is a U.S. National Stage Entry of International Patent Application No. PCT/JP2021/008452, filed Mar. 4, 2021, which claims the benefit of priority to Japanese Patent Application Nos. 2020-046446, filed Mar. 17, 2020, and 2020-118056, filed Jul. 8, 2020, each of which is hereby incorporated herein by reference in its entirety.

TECHNICAL FIELD

The present disclosure relates to a raw material supply system.

BACKGROUND

There is known a technique in which, after a solid raw material is dissolved in a solvent and sprayed into a processing chamber, the interior of the processing chamber is heated to remove the solvent so that a solid raw material remains, and then the processing chamber is heated to sublimate the solid raw material and to produce a corresponding gas (see, for example, Patent Document 1).

PRIOR ART DOCUMENT

Patent Document

Patent Document 1: Japanese Laid-Open Patent Publication No. 2004-115831

The present disclosure provides a technique capable of controlling an amount of a solution or a dispersion stored in a storage part.

SUMMARY

A raw material supply system according to an aspect of the present disclosure includes: a first storage part configured to store a solution obtained by dissolving a first solid raw material in a solvent or a dispersion obtained by dispersing the first solid raw material in the solvent; at least one second storage part configured to store the solution or the dispersion transported from the first storage part; a detection part configured to detect whether an amount of the solution or the dispersion stored in the first storage part is an amount that is capable of being stored in the at least one second storage part; and a heating part configured to heat a second solid raw material formed by removing the solvent from the solution or the dispersion stored in the at least one second storage part.

According to the present disclosure, it is possible to control an amount of a solution or a dispersion stored in a storage part.

DETAILED DESCRIPTION

Figure 1:
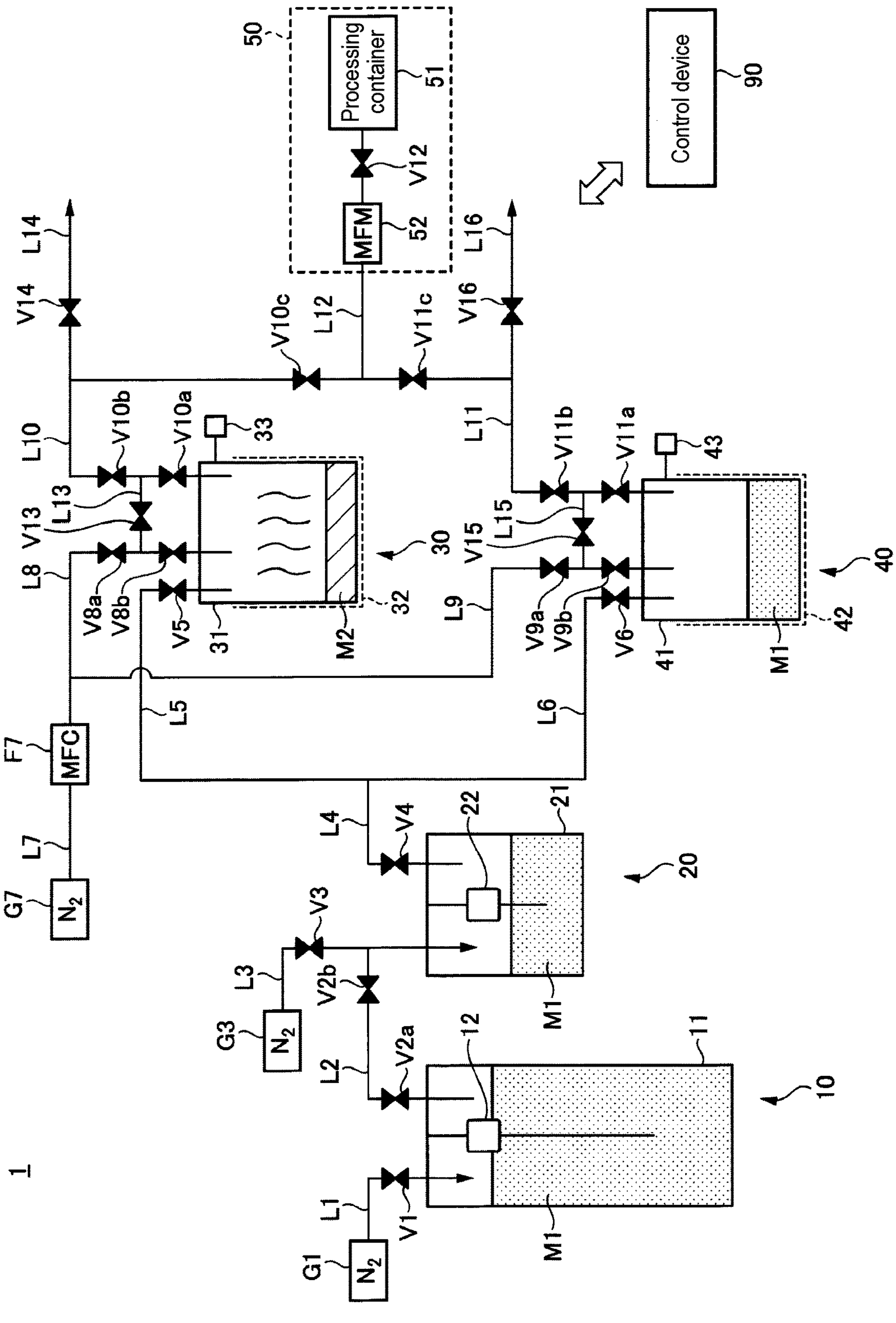
FIG. 1 1 is a view illustrating a raw material supply system according to a first embodiment.

Hereinafter, non-limitative exemplary embodiments of the present disclosure will now be described with reference to the accompanying drawings. In all the accompanying drawings, the same or corresponding members or components will be denoted by the same or corresponding reference numerals, and redundant explanations thereof will be omitted.

First Embodiment (Raw Material Supply System)

A raw material supply system of a first embodiment will be described with reference to FIG. 1. FIG. 1 is a view illustrating the raw material supply system according to the first embodiment.

The raw material supply system 1 is a system that produces a reactive gas obtained by sublimating a second solid raw material formed by removing a solvent from a solution obtained by dissolving a first solid raw material in the solvent (hereinafter, also simply referred to as "solution"), and performs film formation in a processing apparatus by using the produced reactive gas.

The first solid raw material is not particularly limited, but may be, for example, an organic metal complex containing a metal element such as strontium (Sr), molybdenum (Mo), ruthenium (Ru), zirconium (Zr), hafnium (Hf), tungsten (W), aluminum (Al) or the like, or a chloride containing a metal element such as tungsten (W), aluminum (Al) or the like. The solvent may be any material, for example, hexane, as long as it can dissolve or disperse the first solid raw material to form a solution.

The raw material supply system 1 may include a raw material source 10, a buffer apparatus 20, raw material supply apparatuses 30 and 40, a processing apparatus 50, and a control device 90.

The raw material source 10 supplies a solution M1 to the buffer apparatus 20. In the present embodiment, the raw material source 10 includes a tank 11 and a float sensor 12. The tank 11 is filled with the solution M1. The float sensor 12 detects an amount of the solution M1 filled in the tank 11.

One end of a pipe L1 is inserted into the raw material source 10 from above the tank 11. The other end of the pipe L1 is connected to a source G1 of a carrier gas. The carrier gas is supplied from the source G1 into the tank 11 via the pipe L1. The carrier gas is not particularly limited, but may be, for example, an inert gas such as nitrogen ($N_2$), argon (Ar) or the like. A valve V1 is provided in the pipe L1. When the valve V1 is opened, the carrier gas is supplied from the source G1 to the raw material source 10. When the valve V1 is closed, the supply of the carrier gas from the source G1 to the raw material source 10 is cut off. In addition, the pipe L1 may be provided with a flow rate controller (not illustrated) for controlling a flow rate of the carrier gas flowing through the pipe L1, an additional valve, and the like.

One end of a pipe L2 is inserted into the raw material source 10 from above the tank 11. The other end of the pipe L2 is connected to the buffer apparatus 20. When the carrier gas is supplied into the tank 11 from the source G1, the interior of the tank 11 is pressurized, and the solution M1 in the tank 11 is supplied to the buffer apparatus 20 via the pipe L2. Valves V2*a* and V2*b* are provided in the pipe L2 in order from the side of the raw material source 10. When the valves V2*a* and V2*b* are opened, the solution M1 is supplied from the raw material source 10 to the buffer apparatus 20. When the valves V2*a* and V2*b* are closed, the supply of the solution M1 from the raw material source 10 to the buffer apparatus 20 is cut off. The pipe L2 may be provided with a flow rate controller (not illustrated) for controlling a flow rate of the solution M1 flowing through the pipe L2, an additional valve, and the like.

One end of the pipe L3 is connected to the buffer apparatus 20 and the valve V2*b* of the pipe L2. The other end of the pipe L3 is connected to a source G3 of a carrier gas. The carrier gas is supplied from the source G3 to the buffer apparatus 20 via the pipes L3 and L2. The carrier gas is not particularly limited, but may be, for example, an inert gas such as $N_2$, Ar or the like. A valve V3 is provided in the pipe L3. When the valve V3 is opened, the carrier gas is supplied from the source G3 to the buffer apparatus 20, and when the valve V3 is closed, the supply of the carrier gas from the source G3 to the buffer apparatus 20 is cut off. In addition, the pipe L3 may be provided with a flow rate controller (not illustrated) for controlling a flow rate of the carrier gas flowing through the pipe L3, an additional valve, and the like.

The buffer apparatus 20 stores the solution M1 transported from the raw material source 10. In the present embodiment, the buffer apparatus 20 includes a container 21 and a float sensor 22. Further, the buffer apparatus 20 may include a heating part (not illustrated) such as a heater that heats the container 21. The container 21 temporarily stores the solution M1 transported from the raw material source 10. The float sensor 22 detects an amount of the solution M1 stored in the container 21. However, instead of the float sensor 22, another level sensor, such as a load cell type level sensor or a temperature detection type level sensor, may be provided to detect the amount of the solution M1 stored in the container 21.

The buffer apparatus 20 is connected to the raw material supply apparatus 30 via pipes L4 and L5, and supplies the solution M1 to the raw material supply apparatus 30 via the pipes L4 and L5. Valves V4 and V5 are provided in the pipes L4 and L5, respectively. When the valves V4 and V5 are opened, the solution M1 is supplied from the buffer apparatus 20 to the raw material supply apparatus 30, and when the valves V4 and V5 are closed, the supply of the solution M1 from the buffer apparatus 20 to the raw material supply apparatus 30 is cut off. The pipe L5 may be provided with a flow rate controller (not illustrated) for controlling a flow rate of the solution M1 flowing through the pipe L5, an additional valve, and the like.

The buffer apparatus 20 is connected to the raw material supply apparatus 40 via the pipe L4 and a pipe L6, and supplies the solution M1 to the raw material supply apparatus 40 via the pipes L4 and L6. A valve V6 is provided in the pipe L6. When the valves V4 and V6 are opened, the solution M1 is supplied from the buffer apparatus 20 to the raw material supply apparatus 40, and when the valves V4 and V6 are closed, the supply of the solution M1 from the buffer apparatus 20 to the raw material supply apparatus 40 is cut off. The pipe L6 may be provided with a flow rate controller (not illustrated) for controlling a flow rate of the solution M1 flowing through the pipe L6, an additional valve, and the like.

The raw material supply apparatus 30 stores the solution M1 transported from the buffer apparatus 20. In the present embodiment, the raw material supply apparatus 30 includes a container 31, a heating part 32, and a pressure gauge 33. The container 31 stores the solution M1 transported from the buffer apparatus 20. The heating part 32 heats a solid raw material (hereinafter referred to as a "second solid raw material M2") formed by removing the solvent from the solution M1, thereby sublimating the second solid raw material M2 to produce a reactive gas. The heating part 32 may be, for example, a heater disposed so as to cover a bottom portion and an outer periphery of the container 31. The heating part 32 is configured to be able to heat the interior of the container 31 to a temperature capable of sublimating the second solid raw material to produce the reactive gas. The pressure gauge 33 detects an internal pressure of the container 31. Information about the detected internal pressure of the container 31 is transmitted to the control device 90. The control device 90 controls opening/closing operations of various valves based on the detected internal pressure. For example, when the detected internal pressure becomes higher than a predetermined pressure, the control device 90 closes the valve V5 to prevent the excess solution M1 from being supplied to the container 31.

One end of a pipe L8 is inserted into the raw material supply apparatus 30 from above the container 31. The other end of the pipe L8 is connected to a source G7 of a carrier gas via a pipe L7. The carrier gas is supplied from the source G7 into the container 31 via the pipes L7 and L8. The carrier gas is not particularly limited, but may be, for example, an inert gas such as $N_2$, Ar or the like. Valves V8*a* and V8*b* are provided in the pipe L8 in order from the side of the source G7. When the valves V8*a* and V8*b* are opened, the carrier gas is supplied from the source G7 to the raw material supply apparatus 30, and when the valves V8*a* and V8*b* are closed, the supply of the carrier gas from the source G7 to the raw material supply apparatus 30 is cut off. A flow rate controller F7 for controlling a flow rate of the carrier gas flowing through the pipe L7 is provided in the pipe L7. In the present embodiment, the flow rate controller F7 is a mass flow controller (MFC).

The raw material supply apparatus 30 is connected to the processing apparatus 50 via pipes L10 and L12, and supplies the reactive gas to the processing apparatus 50 via the pipes L10 and L12. Valves V10*a* to V10*c* are provided in the pipe L10 in order from the side of the raw material supply apparatus 30. When the valves V10*a* to V10*c* are opened, the reactive gas is supplied from the raw material supply apparatus 30 to the processing apparatus 50, and when the valves V10*a* to V10*c* are closed, the supply of the reactive gas from the raw material supply apparatus 30 to the processing apparatus 50 is cut off.

One end of a pipe L13 is connected between the valve V10*a* and the valve V10*b* of the pipe L10. The other end of the pipe L13 is connected between the valve V8*a* and the valve V8*b* of the pipe L8. The pipe L13 functions as a bypass pipe that connects the pipe L8 and the pipe L10 without interposing the raw material supply apparatus 30. A valve V13 is provided in the pipe L13. When the valve V13 is opened, the pipe L8 and the pipe L10 communicate with each other, and when the valve V13 is closed, the communication between the pipe L8 and the pipe L10 is cut off.

One end of a pipe L14 is connected between the valve V10*b* and the valve V10*c* of the pipe L10. The other end of the pipe L14 is connected to an exhaust apparatus (not illustrated) such as a vacuum pump. A valve V14 is provided in the pipe L14. When the valve V14 is opened in a state in which the valves V10*a* and V10*b* are opened, the interior of the container 31 is exhausted so that the solvent can be removed from the solution M1 stored in the container 31. When the valve V14 is closed, the removal of the solvent from the solution M1 stored in the container 31 can be stopped.

The raw material supply apparatus 40 stores the solution M1 transported from the buffer apparatus 20. The raw material supply apparatus 40 is provided in parallel with the raw material supply apparatus 30. In the present embodiment, the raw material supply apparatus 40 includes a container 41, a heating part 42, and a pressure gauge 43. The container 41 stores the solution M1 transported from the buffer apparatus 20. The heating part 42 heats the second solid raw material M2 formed by removing the solvent from the solution M1, thereby sublimating the second solid raw material M2 to produce a reactive gas. The heating part 42 may be, for example, a heater disposed so as to cover a bottom portion and an outer periphery of the container 41. The heating part 42 is configured to be able to heat the interior of the container 41 to a temperature capable of sublimating the second solid raw material M2 to produce the reactive gas. The pressure gauge 43 detects an internal pressure of the container 41. Information about the detected internal pressure of the container 41 is transmitted to the control device 90. The control device 90 controls opening/closing operations of various valves based on the detected internal pressure. For example, when the detected internal pressure becomes higher than a predetermined pressure, the control device 90 closes the valve V6 to prevent the excess solution M1 from being supplied to the container 41.

One end of the pipe L9 is inserted into the raw material supply apparatus 40 from above the container 41. The other end of the pipe L9 is connected to the source G7 via the pipe L7. The carrier gas is supplied from the source G7 into the container 41 via the pipes L7 and L9. The carrier gas is not particularly limited, but may be, for example, an inert gas such as $N_2$, Ar or the like. Valves V9*a* and V9*b* are provided in the pipe L9 in order from the side of the source G7. When the valves V9*a* and V9*b* are opened, the carrier gas is supplied from the source G7 to the raw material supply apparatus 40, and when the valves V9*a* and V9*b* are closed, the supply of the carrier gas from the source G7 to the raw material supply apparatus 40 is cut off.

The raw material supply apparatus 40 is connected to the processing apparatus 50 via pipes L11 and L12, and supplies the reactive gas to the processing apparatus 50 via the pipes L11 and L12. Valves V11*a* to V11*c* are provided in the pipe L11. When the valves V11*a* to V11*c* are opened, the reactive gas is supplied from the raw material supply apparatus 40 to the processing apparatus 50, and when the valves V11*a* to V11*c* are closed, the supply of the reactive gas from the raw material supply apparatus 40 to the processing apparatus 50 is cut off.

One end of a pipe L15 is connected between the valve V11*a* and the valve V11*b* of the pipe L11. The other end of the pipe L15 is connected between the valve V9*a* and the valve V9*b* of the pipe L9. The pipe L15 functions as a bypass pipe that connects the pipe L9 and the pipe L11 without interposing the raw material supply apparatus 40. A valve V15 is provided in the pipe L15. When the valve V15 is opened, the pipe L9 and the pipe L11 communicate with each other, and when the valve V15 is closed, the communication between the pipe L9 and the pipe L11 is cut off.

One end of a pipe L16 is connected between the valve V11*b* and the valve V11*c* of the pipe L11. The other end of the pipe L16 is connected to an exhaust apparatus (not illustrated) such as a vacuum pump. A valve V16 is provided in the pipe L16. When the valve V16 is opened in a state in which the valves V11*a* and V11*b* are opened, the interior of the container 41 is exhausted so that the solvent can be removed from the solution M1 stored in the container 41. When the valve V16 is closed, the removal of the solvent from the solution M1 stored in the container 41 can be stopped.

The processing apparatus 50 is connected to the raw material supply apparatus 30 via the pipes L10 and L12. The processing apparatus 50 is supplied with the reactive gas produced by heating and sublimating the second solid raw material M2 in the raw material supply apparatus 30. The processing apparatus 50 is connected to the raw material supply apparatus 40 via the pipes L11 and L12. The processing apparatus 50 is supplied with the reactive gas produced by heating and sublimating the second solid raw material M2 in the raw material supply apparatus 40.

The processing apparatus 50 executes various processes such as a film forming process on a substrate such as a semiconductor wafer by using the reactive gases supplied from the raw material supply apparatuses 30 and 40. In the present embodiment, the processing apparatus 50 includes a processing container 51, a flow meter 52, and a valve V12. The processing container 51 accommodates one or more substrates. In the present embodiment, the flow meter 52 is a mass flow meter (MFM). The flow meter 52 is provided in the pipe L12 to measure a flow rate of the reactive gas flowing through the pipe L12. The valve V12 is provided in the pipe L12. When the valve V13 is opened, the reactive gas is supplied from the raw material supply apparatuses 30 and 40 to the processing container 51, and when the valve V13 is closed, the supply of the reactive gas from the raw material supply apparatuses 30 and 40 to the processing container 51 is cut off.

The control device 90 controls each part of the raw material supply system 1. For example, the control device 90 controls the operations of the raw material source 10, the buffer apparatus 20, the raw material supply apparatuses 30 and 40, the processing apparatus 50, and the like. The control device 90 controls the opening/closing of various valves. The control device 90 may be, for example, a computer.

[Operation of Raw Material Supply System]

An example of the operation of the raw material supply system 1 (a raw material supply method) will be described with reference to FIGS. 2 to 5. In the raw material supply system 1, the control device 90 controls the opening/closing operations of various valves to supply the reactive gas from one of the two raw material supply apparatuses 30 and 40, which are provided in a parallel relationship with each other, to the processing apparatus 50, and to fill the other raw material supply apparatus with a solid raw material. Hereinafter, an example of the operation of the raw material supply system 1 will be described in detail.

Figure 2:
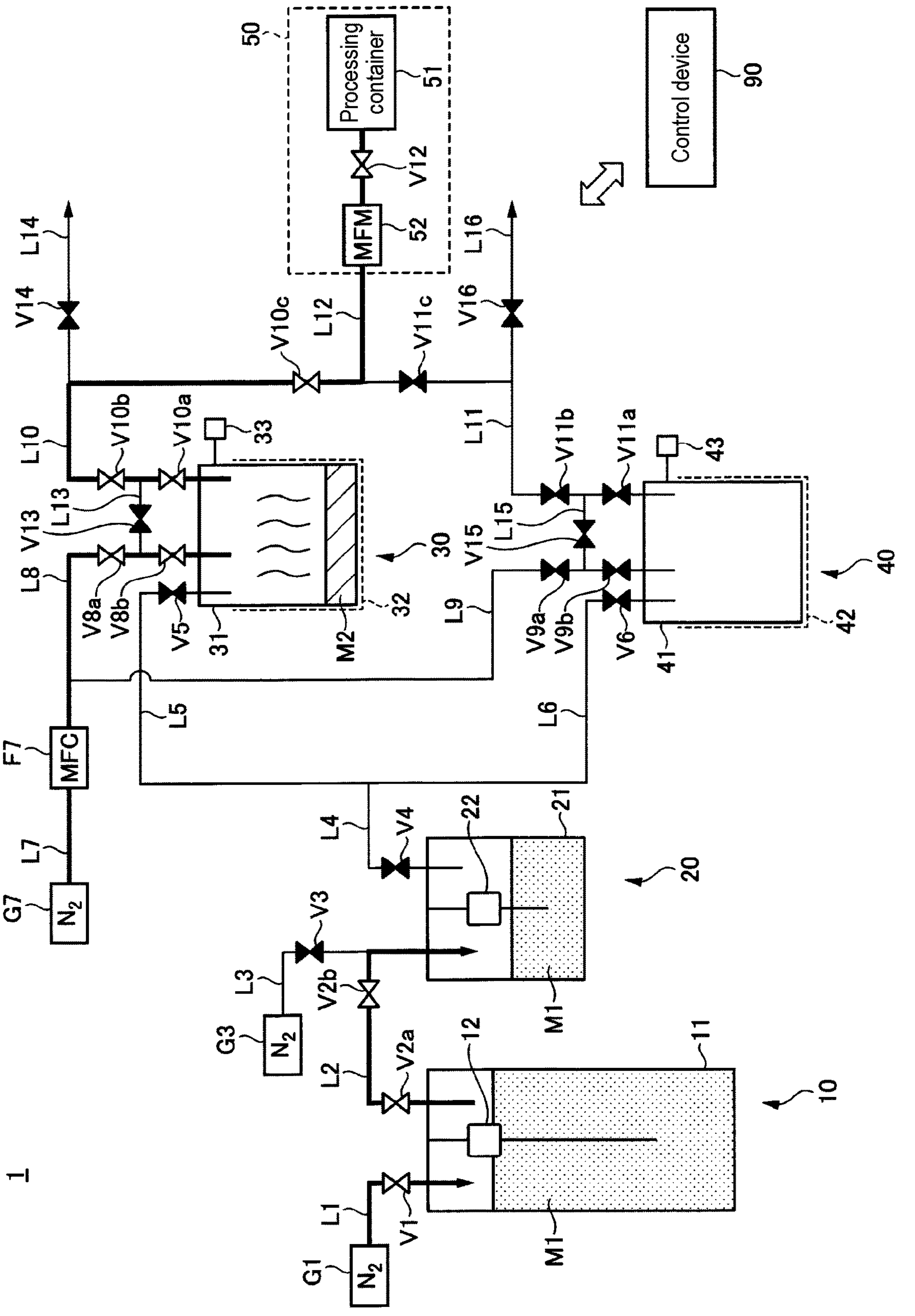
FIG. 2 is a first view for explaining an operation of the raw material supply system of the first embodiment.
Figure 3:
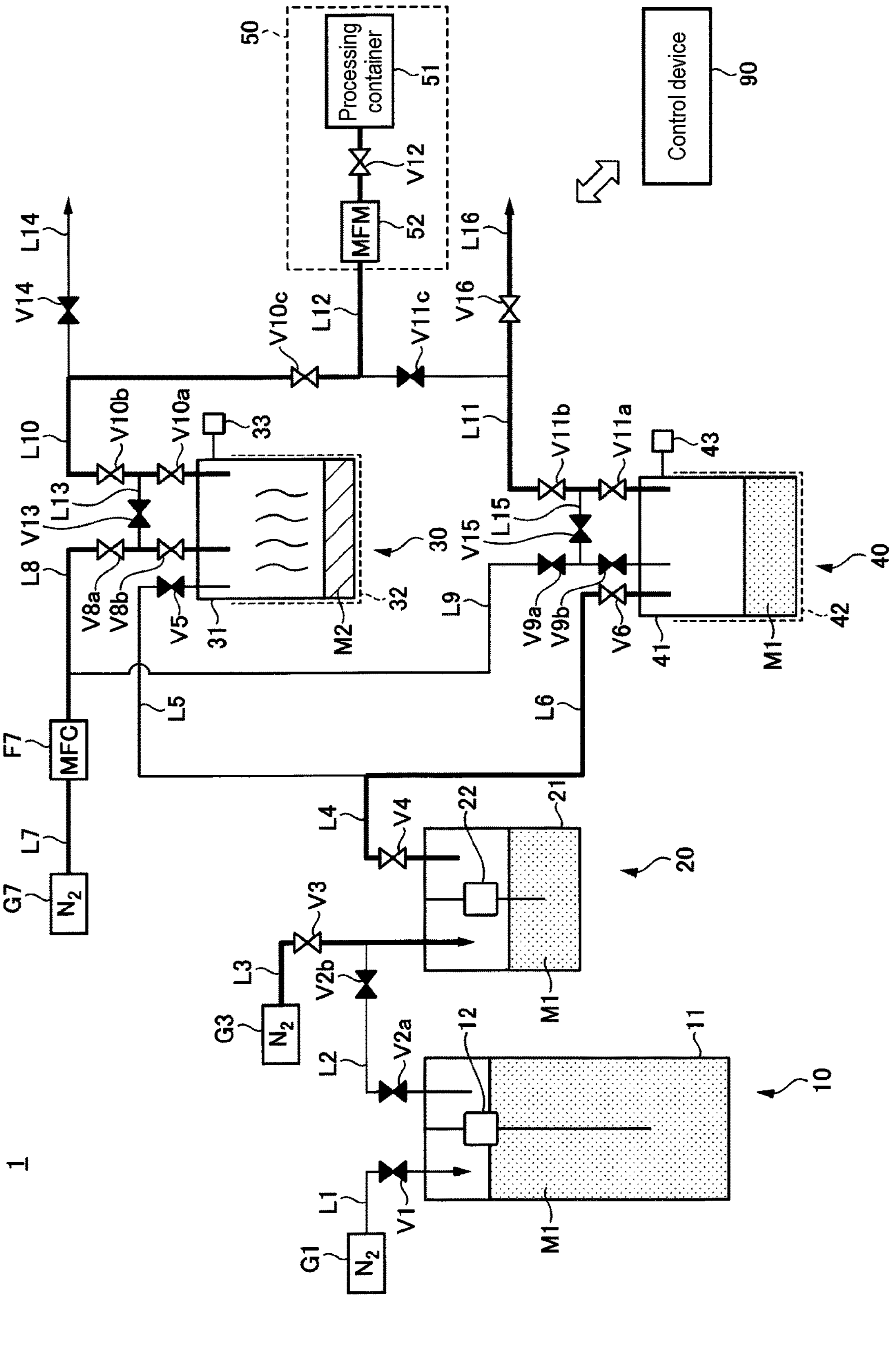
FIG. 3 is a second view for explaining the operation of the raw material supply system of the first embodiment.

First, with reference to FIGS. 2 and 3, a case in which the raw material supply apparatus 30 supplies the reactive gas to the processing apparatus 50 and the raw material supply apparatus 40 is filled with the solid raw material will be described. FIGS. 2 and 3 are views for explaining the operation of the raw material supply system 1. In FIGS. 2 and 3, the pipes through which the carrier gas, the solution M1, and the reactive gas flow are indicated by the thick solid lines, and the pipes through which the carrier gas, the solution M1, and the reactive gas do not flow are indicated by thin solid lines. In addition, in FIGS. 2 and 3, states in which respective valves are open are indicated by the white symbols, and states in which respective valves are closed are indicated by the black symbols. The raw material supply system 1 will be described assuming that all the valves are closed in an initial state as illustrated in FIG. 1, and that the raw material supply apparatus 30 stores the second solid raw material M2.

The control device 90 controls the heating part 32 of the raw material supply apparatus 30 to heat and sublimate the second solid raw material M2 in the container 31, thereby producing the reactive gas. In addition, the control device 90 opens the valves V8*a*, V8*b*, V10*a* to V10*c*, and V12. As a result, the carrier gas is injected from the source G7 into the container 31 of the raw material supply apparatus 30 via the pipes L7 and L8, and the reactive gas produced in the container 31 is supplied to the processing apparatus 50 via the pipes L10 and L12 together with the carrier gas.

The control device 90 opens the valves V1, V2*a*, and V2*b*, as illustrated in FIG. 2. As a result, the carrier gas is supplied from the source G1 to the raw material source 10, the solution M1 is transported from the raw material source 10 to the buffer apparatus 20 via the pipe L2, and the solution M1 is stored in the container 21 of the buffer apparatus 20. At this time, since the valve V4 is closed, the solution M1 stored in the container 21 is not transported to the raw material supply apparatuses 30 and 40.

Subsequently, the control device 90 determines whether or not a predetermined amount of solution M1 is stored in the container 21 based on a detection value of the float sensor 22. The predetermined amount is set to, for example, an amount capable of being stored in the container 41 of the raw material supply apparatus 40. When it is determined that the predetermined amount of solution M1 is stored in the container 21, the control device 90 closes the valves V1, V2*a*, and V2*b* and opens the valves V3, V4, and V6, as illustrated in FIG. 3. As a result, the carrier gas is supplied from the source G3 to the buffer apparatus 20 via the pipe L3, and the solution M1 is transported from the buffer apparatus 20 to the raw material supply apparatus 40 via the pipes L4 and L6. As a result, the predetermined amount of solution M1 is stored in the container 41 of the raw material supply apparatus 40. In addition, the control device 90 opens the valves V11*a*, V11*b*, and V16, as illustrated in FIG. 3. As a result, the interior of the container 41 of the raw material supply apparatus 40 is exhausted by an exhaust apparatus, so that the solvent is removed from the solution M1 in the container 41, and the second solid raw material M2 is formed in the container 41. When removing the solvent from the solution M1 in the container 41, it is preferable for the control device 90 to control the heating part 42 to heat the solution M1 in the container 41 to a predetermined temperature. This facilitates the removal of the solvent. The predetermined temperature is set to be lower than, for example, a temperature at which the second solid raw material M2 is sublimated to produce the reactive gas. FIG. 3 illustrate a state before the solvent is removed from the solution M1 in the container 41.

Figure 4:
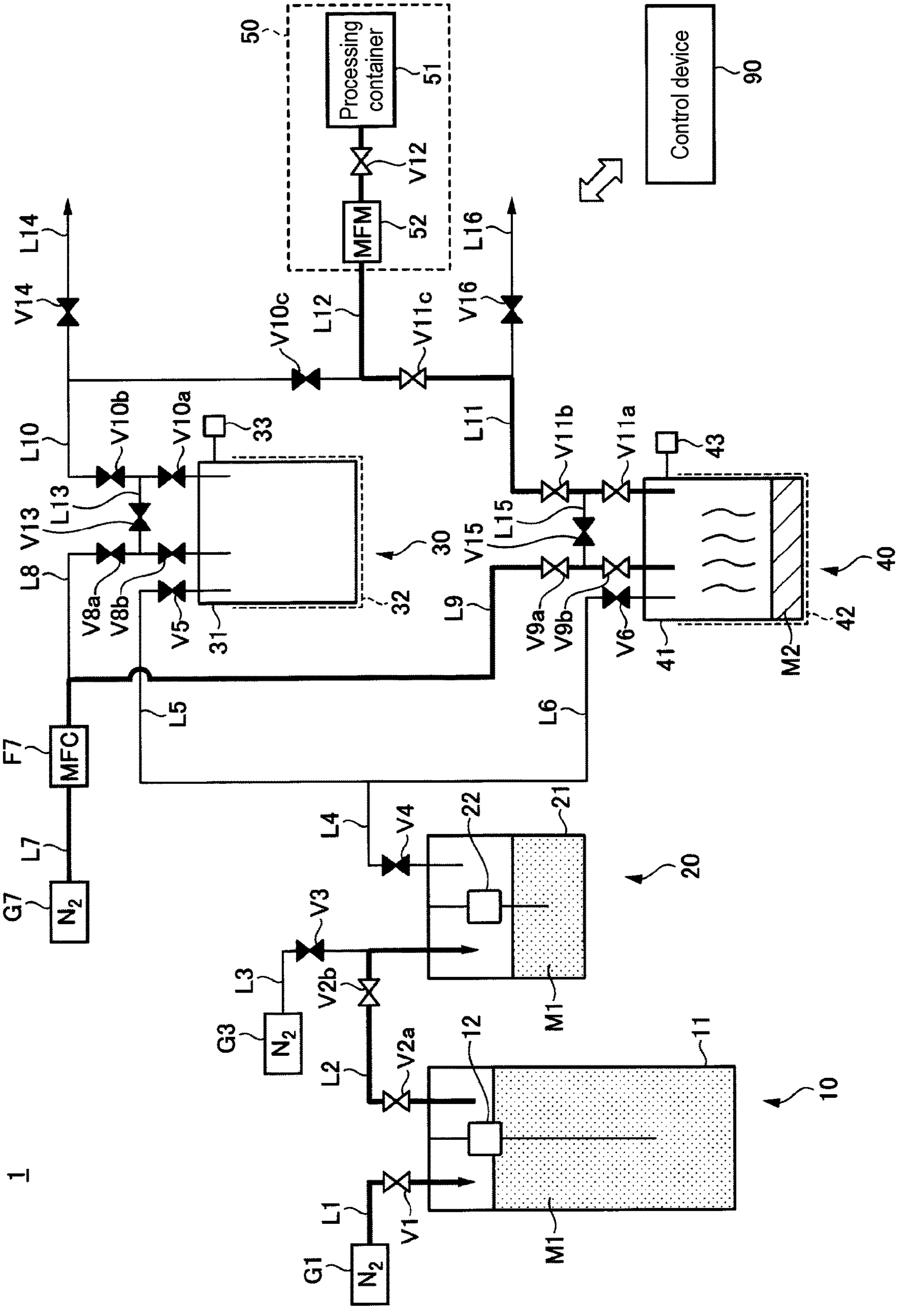
FIG. 4 is a third view for explaining the operation of the raw material supply system of the first embodiment.
Figure 5:
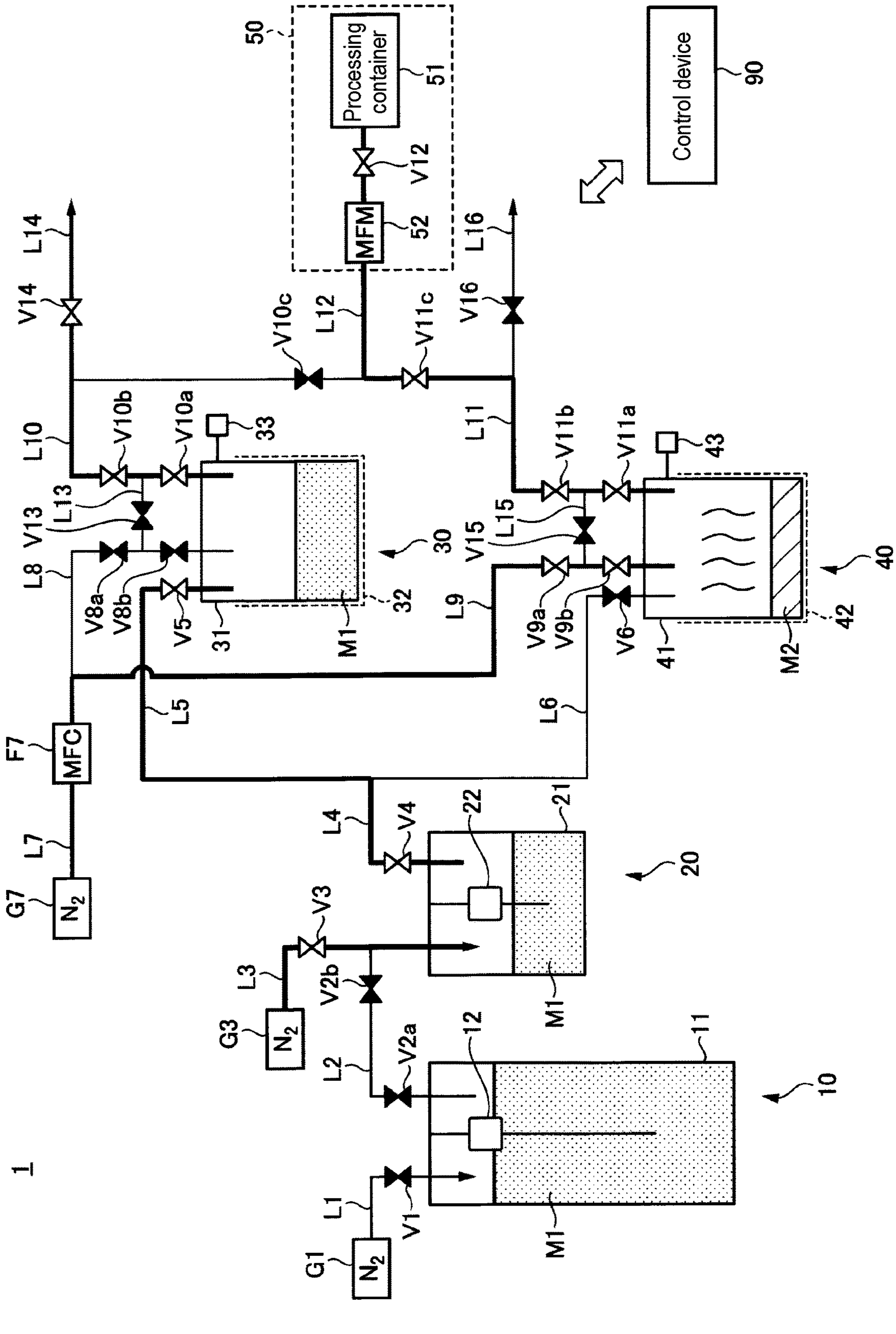
FIG. 5 is a fourth view for explaining the operation of the raw material supply system of the first embodiment.

Next, with reference to FIGS. 4 and 5, a case in which the raw material supply apparatus 40 supplies the reactive gas to the processing apparatus 50 and the raw material supply apparatus 30 is filled with the solid raw material will be described. FIGS. 4 and 5 are views for explaining the operation of the raw material supply system 1. In FIGS. 4 and 5, the pipes through which the carrier gas, the solution M1, and the reactive gas flow are indicated by the thick solid lines, and the pipes through which the carrier gas, the solution M1, and the reactive gas do not flow are indicated by thin solid lines. In addition, in FIGS. 4 and 5, states in which respective valves are open are indicated by the white symbols, and states in which respective valves are closed are indicated by the black symbols. In the raw material supply system 1, it is assumed that all the valves are closed in an initial state, as illustrated in FIG. 1. In addition, the second solid raw material M2 will be described as being stored in the raw material supply apparatus 40, as illustrated in FIG. 4.

The control device 90 controls the heating part 42 of the raw material supply apparatus 40 to heat and sublimate the second solid raw material M2 in the container 41, thereby producing the reactive gas. In addition, the control device 90 opens the valves V9*a*, V9*b*, V11*a* to V11*c*, and V12. As a result, the carrier gas is injected from the source G7 into the container 41 of the raw material supply apparatus 40 via the pipes L7 and L9, and the reactive gas produced in the container 41 is supplied to the processing apparatus 50 via the pipes L11 and L12 together with the carrier gas.

The control device 90 opens the valves V1, V2*a*, and V2*b*, as illustrated in FIG. 4. As a result, the carrier gas is supplied from the source G1 to the raw material source 10, the solution M1 is transported from the raw material source 10 to the buffer apparatus 20 via the pipe L2, and the solution M1 is stored in the container 21 of the buffer apparatus 20. At this time, since the valve V4 remains closed, the solution M1 stored in the container 21 is not transported to the raw material supply apparatuses 30 and 40.

Subsequently, the control device 90 determines whether or not a predetermined amount of solution M1 is stored in the container 21 based on a detection value of the float sensor 22. The predetermined amount is set to, for example, an amount capable of being stored in the container 31 of the raw material supply apparatus 30. When it is determined that the predetermined amount of solution M1 is stored in the container 21, the control device 90 closes the valves V1, V2*a*, and V2*b* and opens the valves V3, V4, and V5, as illustrated in FIG. 5. As a result, the carrier gas is supplied from the source G3 to the buffer apparatus 20 via the pipe L3, and the solution M1 is transported from the buffer apparatus 20 to the raw material supply apparatus 30 via the pipes L4 and L5. As a result, the predetermined amount of solution M1 is stored in the container 31 of the raw material supply apparatus 30. In addition, the control device 90 opens the valves V10*a*, V10*b*, and V14, as illustrated in FIG. 5. As a result, the interior of the container 31 of the raw material supply apparatus 30 is exhausted by the exhaust apparatus, so that the solvent is removed from the solution M1 in the container 31, and the second solid raw material M2 is formed in the container 31. When removing the solvent from the solution M1 in the container 31, it is preferable for the control device 90 to control the heating part 32 to heat the solution M1 in the container 31 to a predetermined temperature. This facilitates the removal of the solvent. The predetermined temperature is set to be lower than, for example, a temperature at which the second solid raw material is sublimated to produce the reactive gas. FIG. 5 illustrate a state before the solvent is removed from the solution M1 in the container 41.

As described above, according to the raw material supply system 1, the control device 90 controls the opening/closing operations of respective valves so that the reactive gas is supplied from one of the two raw material supply apparatuses 30 and 40 to the processing apparatus 50, and the other raw material supply apparatus is filled with the solid raw material. This makes it possible for the raw material to be automatically replenished to the raw material supply apparatuses 30 and 40, to improve the continuous operation performance of the processing apparatus 50, and to improve the operating rate of the processing apparatus 50.

In addition, according to the raw material supply system 1, the buffer apparatus 20 including the float sensor 22 is provided between the raw material source 10 and the raw material supply apparatuses 30 and 40. This makes it possible to control a liquid amount of the solution M1 to be transported from the raw material source 10 inside the buffer apparatus 20, and to transport the controlled amount of solution M1 to the raw material supply apparatuses 30 and 40. Therefore, it is possible to control the liquid amount of the solution M1 stored in the raw material supply apparatuses 30 and 40 even without providing the float sensor in the raw material supply apparatuses 30 and 40. As a result, it is possible to heat sublimate the solution M1 in the raw material supply apparatuses 30 and 40 without being restricted in uses by the level sensor, such as a heat-resistant temperature, a heat cycle durability, and an operational reliability of the float sensor. That is, it is possible to expand a range of the temperature at which the solution M1 can be heated in the raw material supply apparatuses 30 and 40.

Second Embodiment

Figure 6:
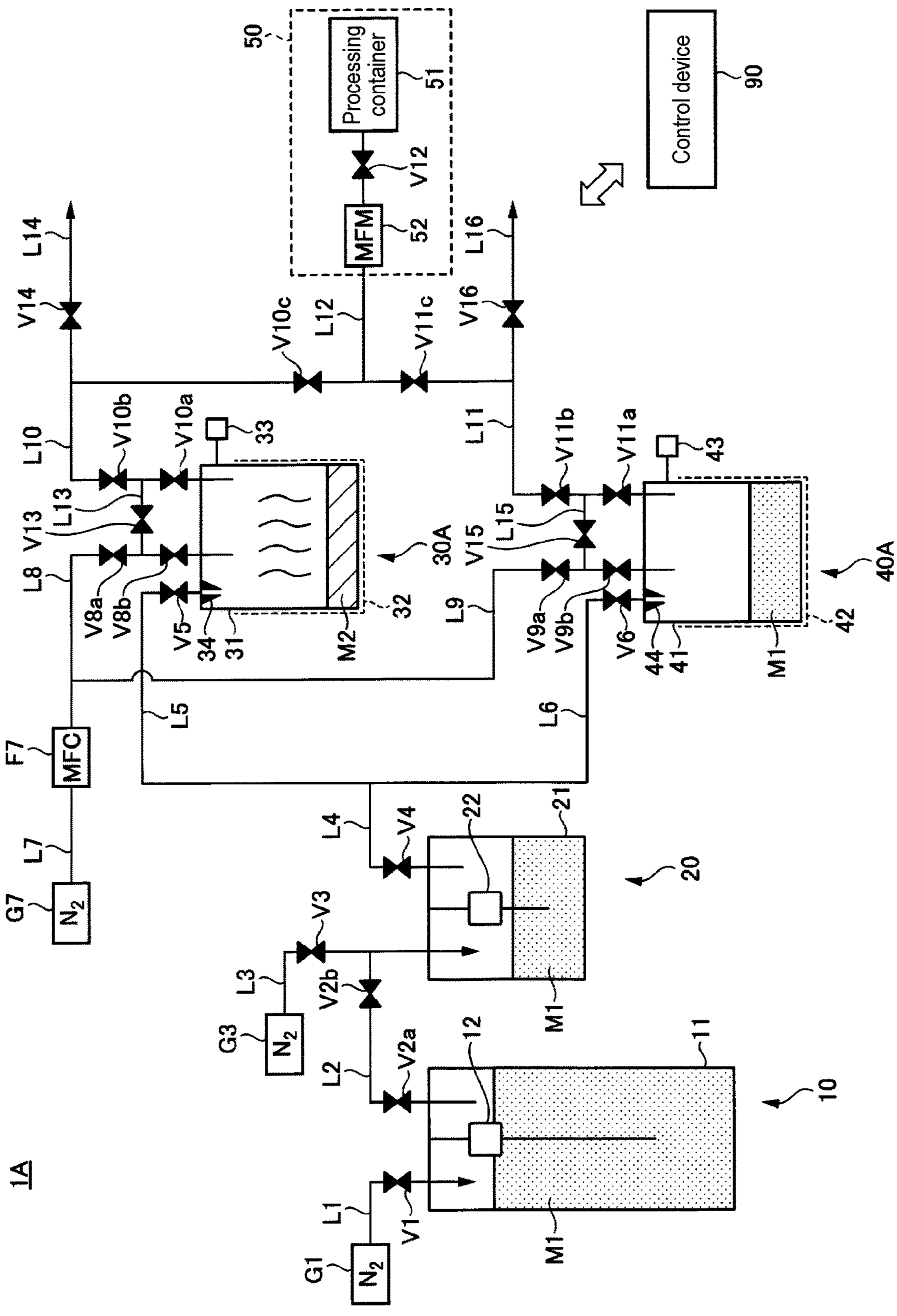
FIG. 6 is a view illustrating a raw material supply system according to a second embodiment.

A raw material supply system of a second embodiment will be described with reference to FIG. 6. FIG. 6 is a view illustrating the raw material supply system according to the second embodiment.

The raw material supply system 1A is different from the raw material supply system 1 of the first embodiment in that raw material supply apparatuses 30A and 40A include raw material injection parts 34 and 44 that spray a solution M1 transported from the buffer apparatus 20 and inject the solution M1 into containers 31 and 41, respectively. Since the other configurations are the same as those of the raw material supply system 1 of the first embodiment, different configurations will be mainly described below.

The raw material supply apparatus 30A stores the solution M1 transported from the buffer apparatus 20. In the present embodiment, the raw material supply apparatus 30A includes a container 31, a heating part 32, a pressure gauge 33, and a raw material injection part 34. The container 31 stores the solution M1 transported from the buffer apparatus 20. The heating part 32 heats the second solid raw material M2 formed by removing the solvent from the solution M1, thereby sublimating the second solid raw material M2 to produce the reactive gas.

The heating part 32 may be, for example, a heater disposed so as to cover the bottom portion and the outer periphery of the container 31. The heating part 32 is configured to be able to heat the interior of the container 31 to a temperature capable of sublimating the second solid raw material M2 to produce the reactive gas. The pressure gauge 33 detects the internal pressure of the container 31. Information about the detected internal pressure of the container 31 is transmitted to the control device 90. The control device 90 controls the opening/closing operations of various valves based on the detected internal pressure. For example, when the detected internal pressure becomes higher than a predetermined pressure, the control device 90 closes the valve V5 to prevent the excess solution M1 from being supplied to the container 31.

The raw material injection part 34 sprays the solution M1 transported from the buffer apparatus 20 via the pipes L4 and L5 and injects the solution M1 into the container 31. By spraying the solution M1 by the raw material injection part 34, the solvent is vaporized before the solution M1 reaches the bottom portion of the container 31 or the like, and deposited as the second solid raw material M2. The raw material injection part 34 may be, for example, a spray nozzle.

The raw material supply apparatus 40A stores the solution M1 transported from the buffer apparatus 20. In the present embodiment, the raw material supply apparatus 40A includes a container 41, a heating part 42, a pressure gauge 43, and a raw material injection part 44.

The container 41, the heating part 42, the pressure gauge 43, and the raw material injection part 44 may have the same configurations as the container 31, the heating part 32, the pressure gauge 33, and the raw material injection part 34 in the raw material supply apparatus 30A.

As described above, according to the raw material supply system 1A, as in the raw material supply system 1, the control device 90 controls the opening/closing operations of the valves, so that one of the two raw material supply apparatuses 30A and 40A supplies the reactive gas to the processing apparatus 50 and the other is filled with the solid raw material. This makes it possible for the raw material to be automatically replenished to the raw material supply apparatuses 30A and 40A, to improve the continuous operation performance of the processing apparatus 50, and to improve the operating rate of the processing apparatus 50.

According to the raw material supply system 1A, by spraying and injecting the solution M1 into the containers 31 and 41 from the raw material injection parts 34 and 44, respectively, the solvent is vaporized before the solution M1 reaches the bottom portions of the containers 31 and 41 and the like, and deposited as the second solid raw material M2. As described above, in the raw material supply system 1A, since the solution M1 injected into the containers 31 and 41 is deposited and stored as the solid material on the bottom portions of the containers 31 and 41, it is possible to increase an amount of storable solid raw material per fixed volume.

In the raw material supply system 1A, the solution M1 obtained by dissolving the solid raw material in the solvent is sprayed and vaporized, and deposited once on the bottom portions of the containers 31 and 41 as the second solid raw material M2. Thereafter, the second solid raw material M2 is sublimated and supplied to the processing apparatus 50. This facilitates control such as simplification of flow rate control or increase in flow rate.

According to the raw material supply system 1A, as in the raw material supply system 1, the buffer apparatus 20 including the float sensor 22 is provided between the raw material source 10 and the raw material supply apparatuses 30A and 40A. This makes it possible to control a liquid amount of solution M1 transported from the raw material source 10 in the buffer apparatus 20, to transport the solution M1 of the controlled liquid amount to the raw material supply apparatuses 30A and 40A, and to spray the solution M1 into the containers 31 and 41 from the raw material injection parts 34 and 44. Therefore, it is possible to control a storage amount of the second solid raw material M2 deposited as the solvent is vaporized by the spraying of the solution M1 into the containers 31 and 41.

Third Embodiment

Figure 7:
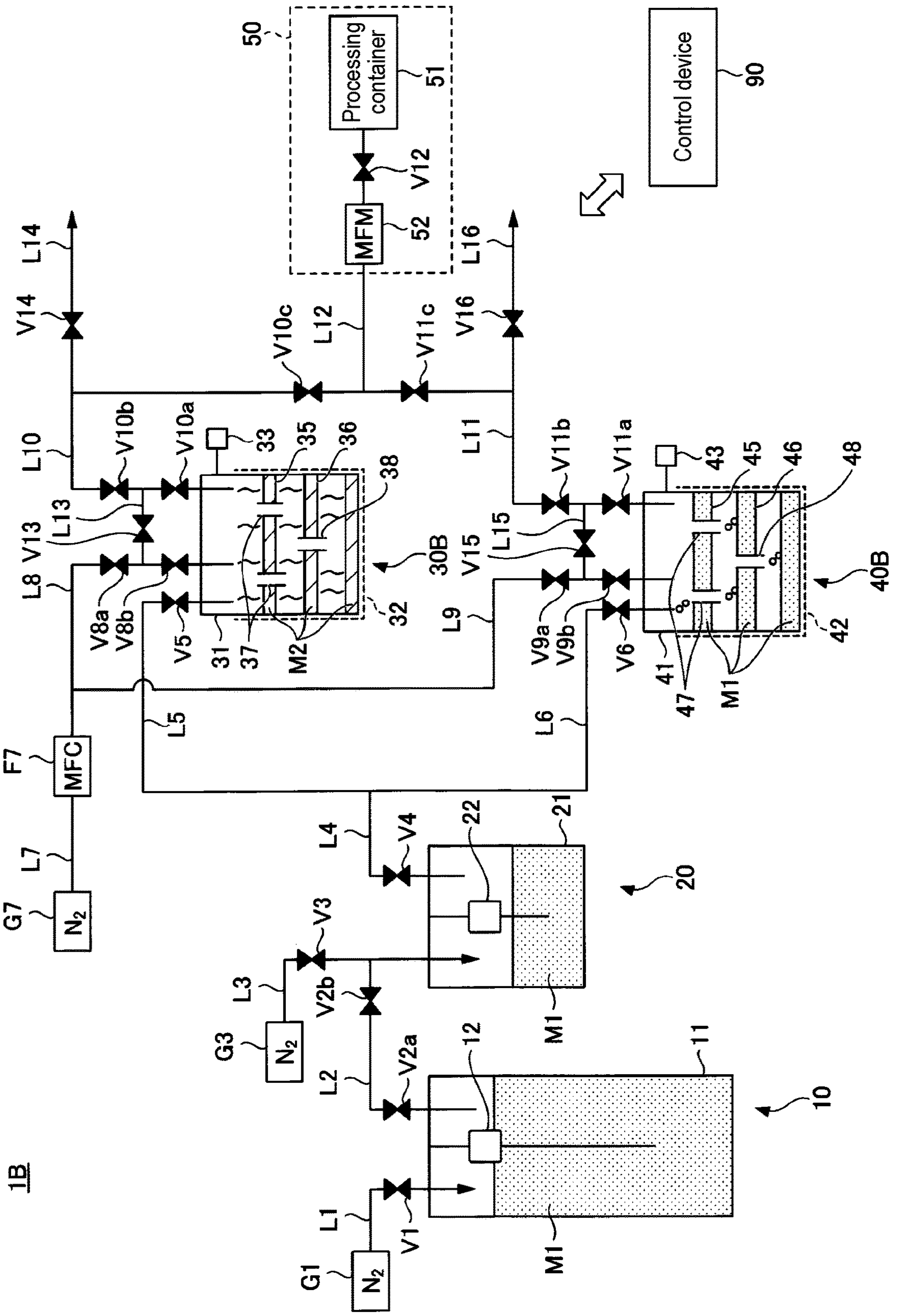
FIG. 7 is a view illustrating a raw material supply system according to a third embodiment.

A raw material supply system of a third embodiment will be described with reference to FIG. 7. FIG. 7 is a view illustrating the raw material supply system according to the third embodiment.

A raw material supply system 1B is different from the raw material supply system 1 of the first embodiment in that each of the interiors of the containers 31 and 41 is formed in multiple stages. Since the other configurations are the same as those of the raw material supply system 1 of the first embodiment, different configurations will be mainly described below.

The raw material supply apparatus 30B stores the solution M1 transported from the buffer apparatus 20. In the present embodiment, the raw material supply apparatus 30B includes a container 31, a heating part 32, a pressure gauge 33, partition plates 35 and 36, and through pipes 37 and 38.

The container 31, the heating part 32, and the pressure gauge 33 may be the same as those of the raw material supply apparatus 30 of the first embodiment.

The partition plate 35 is provided inside the container 31 and divides the interior of the container 31 into two upper and lower regions. The partition plate 35 is made of a material that is impermeable to a solution, a solid raw material and a reactive gas, such as stainless steel or a nickel alloy.

The partition plate 36 is provided below the partition plate 35 inside the container 31, and divides a region below the partition plate 35 inside the container 31 into two upper and lower regions. The partition plate 36 is made of, for example, the same material as that of the partition plate 35.

The through pipe 37 is provided to penetrate the partition plate 35 in a thickness direction (vertical direction), and the solution and the reactive gas pass through the partition plate 35 through the through pipe 37. A height extending upward from the top surface of the partition plate 35 of the through pipe 37 is high enough to secure a required amount of raw material. One or more (two in the illustrated example) through pipes 37 are provided in the plane of the partition plate 35.

The through pipe 38 is provided to penetrate the partition plate 36 in the thickness direction (vertical direction), and the solution and the reactive gas pass through the partition plate 36 through the through pipe 38. A height extending upward from the top surface of the partition plate 36 of the through pipe 38 is high enough to secure a required amount of raw material. One or more (one in the illustrated example) through pipes 38 are provided in the plane of the partition plate 36.

As described above, since the partition plates 35 and 36 are provided inside the container 31, the solution transported from the buffer apparatus 20 into the container 31 is stored on the partition plate 35, on the partition plate 36, and on the bottom of the container 31. Therefore, since a specific surface area, which is a surface area per unit volume of the solution stored in the container 31, becomes large, it is possible to shorten a time for removing the solvent from the solution. In addition, it is possible to increase an amount of the reactive gas produced by sublimating the solid raw material formed by removing the solvent from the solution.

The raw material supply apparatus 40B stores the solution M1 transported from the buffer apparatus 20. In the present embodiment, the raw material supply apparatus 40B includes a container 41, a heating part 42, a pressure gauge 43, partition plates 45 and 46, and through pipes 47 and 48.

The container 41, the heating part 42, the pressure gauge 43, the partition plates 45 and 46 and the through pipes 47 and 48 have the same configurations as the container 31, the heating part 32, the pressure gauge 33, the partition plates 35 and 36 and the through pipes 37 and 38 in the raw material supply apparatus 30B.

As described above, since the partition plates 45 and 46 are provided inside the container 41, the solution transported from the buffer apparatus 20 into the container 41 is stored on the partition plate 45, on the partition plate 46, and on the bottom of the container 41. Therefore, since a specific surface area, which is a surface area per unit volume of the solution stored in the container 41, becomes large, it is possible to shorten a time for removing the solvent from the solution. In addition, it is possible to increase an amount of the reactive gas produced by sublimating the solid raw material formed by removing the solvent from the solution.

As described above, according to the raw material supply system 1B, as in the raw material supply system 1, the control device 90 controls the opening/closing operations of the valves, so that one of the two raw material supply apparatuses 30B and 40B supplies the reactive gas to the processing apparatus 50 and the other is filled with the solid raw material. This makes it possible for the raw material to be automatically replenished to the raw material supply apparatuses 30B and 40B, to improve the continuous operation performance of the processing apparatus 50, and to improve the operating rate of the processing apparatus 50.

According to the raw material supply system 1B, as in the raw material supply system 1, the buffer apparatus 20 including the float sensor 22 is provided between the raw material source 10 and the raw material supply apparatuses 30B and 40B. This makes it possible to control a liquid amount of the solution M1 to be transported from the raw material source 10 in the buffer apparatus 20, and to transport the controlled amount of the solution M1 to the raw material supply apparatuses 30B and 40B. Therefore, it is possible to control the liquid amount of the solution M1 stored in the raw material supply apparatuses 30B and 40B even without providing the float sensor in the raw material supply apparatuses 30B and 40B. As a result, it is possible to heat and sublimate the solution M1 in the raw material supply apparatuses 30B and 40B without being restricted in uses by the level sensor such as a heat-resistant temperature, a heat cycle durability, and an operational reliability of the float sensor. That is, it is possible to expand a range of a temperature at which the solution M1 can be heated in the raw material supply apparatuses 30B and 40B.

According to the raw material supply system 1B, each of the interiors of the containers 31 and 41 is formed in multiple stages. As a result, the solution transported from the buffer apparatus 20 into the containers 31 and 41 is stored on the partition plates 35 and 45, on the partition plates 36 and 46, and on the bottom of the containers 31 and 41. Therefore, since a specific surface area, which is a surface area per unit volume of the solution stored in the containers 31 and 41, becomes large, it is possible to shorten a time for removing the solvent from the solution. In addition, it is possible to increase an amount of the reactive gas produced by sublimating the solid raw material formed by removing the solvent from the solution.

In the third embodiment, the case in which each of the interiors of the containers 31 and 41 of the raw material supply system 1 of the first embodiment is formed in multiple stages has been described, but the present disclosure is not limited thereto. For example, each of the interiors of the containers 31 and 41 of the raw material supply system 1A of the second embodiment may be formed in multiple stages.

In the above-described embodiments, the buffer apparatus 20 is an example of a first storage part, the raw material supply apparatuses 30, 30A, 30B, 40, 40A, and 40B are examples of second storage parts, and the float sensor 22 is an example of a detection part. In addition, the pipes L10 and L11 are examples of exhaust ports, and the raw material injection parts 34 and 44 are examples of injection parts. The control device 90 is an example of a controller.

The embodiments disclosed herein should be considered to be exemplary in all respects and not restrictive. The above-described embodiments may be omitted, replaced, or modified in various forms without departing from the scope and spirit of the appended claims.

In the above-described embodiments, the system in which the second solid raw material M2 formed by removing the solvent from the solution M1 is sublimated to produce the reactive gas, and the produced reactive gas is used to form a film in the processing apparatus 50 has been described, the present disclosure is not limited thereto. For example, instead of the solution M1, a dispersion such as a slurry obtained by dispersing the first solid raw material in a solvent or a sol obtained by dispersing the first solid raw material in a solvent may be used. For example, by using the sol, it is possible to fill a precursor having a higher concentration than using the solution M1 or the slurry. The slurry is also referred to as a suspension. The sol is also referred to as a colloidal solution.

The present international application claims priority based on Japanese Patent Application No. 2020-046446 filed on Mar. 17, 2020 and Japanese Patent Application No. 2020-118056 filed on Jul. 8, 2020, the disclosures of which are incorporated herein by reference in their entireties.

EXPLANATION OF REFERENCE NUMERALS

1, 1A, 1B: raw material supply system, 20: buffer apparatus, 22: float sensor, 30, 30A, 30B, 40, 40A, 40B: raw material supply apparatus, 32, 42: heating part

The invention claimed is:

1. A raw material supply system comprising:

a first storage configured to store a solution obtained by dissolving a first solid raw material in a solvent or a dispersion obtained by dispersing the first solid raw material in the solvent, the first storage being connected to a raw material source which is filled with the solution or the dispersion;

at least one second storage configured to store the solution or the dispersion transported from the first storage;

a detector configured to detect whether an amount of the solution or the dispersion stored in the first storage is an amount that is capable of being stored in the at least one second storage;

a heater configured to heat a second solid raw material formed by removing the solvent from the solution or the dispersion stored in the at least one second storage; and a controller configured to execute steps of:

transporting the solution or the dispersion from the raw material source to the first storage;

transporting the solution or the dispersion from the first storage to the at least one second storage without transporting the solution or the dispersion from the raw material source to the first storage; and removing the solvent from the solution or the dispersion in the at least one second storage, wherein the at least one second storage includes:

a container configured to store the solution or the dispersion;

one or more partition plates provided to divide an interior of the container into a plurality of regions; and a through pipe provided in each of the one or more partition plates to penetrate the one or more partition plates in a thickness direction, and wherein an amount of the solution or the dispersion stored on the one or more partition plates is determined according to a height of the through pipe, which extends from an upper surface of the one or more partition plates.

2. The raw material supply system of claim 1, wherein the at least one second storage includes:

an exhaust port configured to exhaust the interior of the container.

3. The raw material supply system of claim 2, wherein the exhaust port is connected to a processing apparatus configured to perform a process using a reactive gas obtained by heating and sublimating the second solid raw material.

4. The raw material supply system of claim 3, wherein the exhaust port is connected to an exhaust apparatus configured to exhaust the interior of the container.

5. The raw material supply system of claim 4, wherein the at least one second storage includes:

an injector configured to spray the solution or the dispersion to inject the solution or the dispersion into the container.

6. The raw material supply system of claim 5, wherein the at least one second storage includes a plurality of second storages provided in a parallel relationship with each other.

7. The raw material supply system of claim 6, wherein the detector includes a float sensor.

8. The raw material supply system of claim 7, further comprising:

a flow meter configured to measure a flow rate of the reactive gas obtained by heating and sublimating the second solid raw material.

9. The raw material supply system of claim 8, further comprising:

a pressure gauge configured to measure an internal pressure of the at least one second storage.

10. The raw material supply system of claim 1, wherein the controller is further configured to execute a step of generating a reactive gas obtained by heating and sublimating the second solid raw material formed by removing the solvent from the solution or the dispersion.

11. The raw material supply system of claim 1, wherein the at least one second storage includes:

an injector configured to spray the solution or the dispersion to inject the solution or the dispersion into the container.

12. The raw material supply system of claim 1, wherein the at least one second storage includes a plurality of second storages provided in a parallel relationship with each other.

13. The raw material supply system of claim 1, wherein the detector includes a float sensor.

14. The raw material supply system of claim 1, wherein the dispersion is a slurry.

15. The raw material supply system of claim 1, further comprising:

a flow meter configured to measure a flow rate of a reactive gas obtained by heating and sublimating the second solid raw material.

16. The raw material supply system of claim 1, further comprising:

a pressure gauge configured to measure an internal pressure of the at least one second storage.

17. A raw material supply method, comprising:

transporting a solution obtained by dissolving a first solid raw material in a solvent or a dispersion obtained by dispersing the first solid raw material in the solvent from a raw material source, which is filled with the solution or the dispersion, to a first storage connected to the raw material source;

storing the solution or the dispersion in the first storage;

determining whether or not the solution or the dispersion is stored at a set amount in the first storage, based on a detection value of a detector provided in the first storage;

when the solution or the dispersion is determined to be stored at the set amount in the first storage, transporting the solution or the dispersion from the first storage to at least one second storage using a carrier gas without transporting the solution or the dispersion from the raw material source to the first storage;

forming a second solid raw material by removing the solvent from the solution or the dispersion stored in the at least one second storage; and heating and sublimating the second solid raw material to produce a reactive gas, wherein the set amount is an amount that is capable of being stored in the at least one second storage, wherein the at least one second storage includes:

a container configured to store the solution or the dispersion;

one or more partition plates provided to divide an interior of the container into a plurality of regions; and a through pipe provided in each of the one or more partition plates to penetrate the one or more partition plates in a thickness direction, and wherein an amount of the solution or the dispersion stored on the one or more partition plates is determined according to a height of the through pipe, which extends from an upper surface of the one or more partition plates.

* * * * *